United States Patent
Barbieri et al.

(10) Patent No.: US 7,952,503 B2
(45) Date of Patent: May 31, 2011

(54) HIGH SPEED VOLTAGE FOLLOWING DEVICE FOR ANALOG-TO-DIGITAL CONVERSION SYSTEM

(75) Inventors: Andrea Barbieri, Lodi (IT); Germano Nicollini, Piacenza (IT)

(73) Assignee: ST-Ericsson SA, Plan-les-Ouates (CH)

( * ) Notice: Subject to any disclaimer, the term of this patent is extended or adjusted under 35 U.S.C. 154(b) by 12 days.

(21) Appl. No.: 12/484,919

(22) Filed: Jun. 15, 2009

(65) Prior Publication Data

US 2010/0001890 A1   Jan. 7, 2010

(30) Foreign Application Priority Data

Jul. 4, 2008   (IT) .............. MI2008A1230

(51) Int. Cl.
*H03M 1/00* (2006.01)
(52) U.S. Cl. ....................... 341/133; 341/155
(58) Field of Classification Search .................. 341/133, 341/144, 155, 135, 136
See application file for complete search history.

(56) References Cited

U.S. PATENT DOCUMENTS

| | | | |
|---|---|---|---|
| 4,542,370 A * | 9/1985 | Yamada et al. | 341/133 |
| 6,456,214 B1 * | 9/2002 | van der Wagt | 341/133 |
| 2004/0150464 A1 | 8/2004 | Khalid | |
| 2007/0285159 A1 | 12/2007 | Moyer | |

OTHER PUBLICATIONS

Kenney et al., "An Enhanced Slew Rate Source Follower," IEEE Journal of Solid-State Circuits, 30(2):144-146, Feb. 1995.
Fan et al., "Analysis and Design of Low-Distortion CMOS Source Followers," IEEE Transactions on Circuits and Systems Part 1: Regular Papers, 52(8):1489-1501, Aug. 2005.
Fan et al., "Improving Source-Follower Buffer for High-Speed ADC Testing," IEEE Asia Pacific Conference on Circuits and Systems (APCCAS), Piscataway, NJ, USA, Dec. 1, 2006, pp. 21-24.

* cited by examiner

*Primary Examiner* — Brian Young
(74) *Attorney, Agent, or Firm* — Timothy L. Boller; Seed IP Law Group PLLC

(57) ABSTRACT

A voltage following device is described, for the driving of a sampling network coupleable to an analog/digital converter, comprising at least one first transistor provided with a first terminal to receive an input signal, and a second terminal to provide an output signal to the sampling network which is representative of the input signal translation of an amount equal to a gate and source voltage of said at least one first transistor. The voltage following device having a driving network of said at least one first transistor to keep said gate and source voltage equal to a shift reference voltage.

22 Claims, 6 Drawing Sheets

HIGH SPEED VOLTAGE FOLLOWING DEVICE FOR ANALOG-TO-DIGITAL CONVERSION SYSTEM

BACKGROUND

1. Technical Field

The present disclosure relates to analog/digital (A/D) converters and, in particular, to a high-speed voltage following device for conversion systems of the analog/digital type (hereinafter, for the sake of brevity, A/D conversion systems).

2. Description of the Related Art

With reference to FIG. 1, a system 100 for A/D conversion of an electric signal is typically composed of a sampling network RCM, for example, a capacitive input stage of the "Sample and Hold" type, per se known, for the sampling of the electric signal provided by a signal source S which is variable between a first reference voltage (0 Volt) and a second reference voltage (VREF, reference voltage of the converter). The sampling network RCM results to be further coupled to an A/D converter CAD, also of a known type.

In some critical applications, for example, if the signal source S has to "see" a high impedance (for example, above 1 Giga-Ohm), it is necessary, as illustrated in FIG. 2, to modify the A/D conversion system 100 by adding a following device 200 (also known by the name of buffer device or, simply, buffer) interposed between the signal source S and the sampling network RCM for driving the same sampling network RCM to the aim of ensuring an infinite input impedance to the A/D converter CAD.

The buffer device 200, beside the high input impedance (which is, in theory, infinite), requires such an operating band as not to limit the frequencies of the input signal, and such a power supply rejection ratio PSRR as to drive the capacitive input stage RCM so as not to degrade the A/D converter CAD performance.

With reference to FIG. 3, a first buffer device 201 belonging to the prior art is composed of an operational amplifier OA1 with an input of the p-channel type in a non-inverting configuration with unity gain. The first buffer device of FIG. 3 is arranged to receive an input signal VI on a first input terminal of a non-inverting type, and to provide an output signal VOUT on an output terminal.

The first buffer device 201 of FIG. 3 has the drawback of resulting not usable for an input signal with a value near 0 Volts, since, as it is known to those skilled in the art, the operational amplifier OA1 output stage is not capable of operating with signals having a voltage value near 0 Volts. Furthermore, the use of the operational amplifier OA1 has the drawback of limiting the operating band of the A/D converter in which the first buffer device 201 is employed.

With reference to FIG. 4, a second buffer device 202 of a known type, alternative to that illustrated in FIG. 3, results to be composed of an operational amplifier OA2 with p-channel input in an inverting configuration with unity gain, and a transistor M1 of the p-channel MOS type.

The second buffer device 202 results to be provided with an input terminal to receive an input signal VI, and an output terminal connected to the transistor M1 gate terminal to provide a control voltage VC thereto.

The source and drain terminals of the transistor M1 are connected to a supply voltage VDD and a ground potential GND, respectively, through respective biasing resistors R. The transistor M1 source terminal represents the output terminal VOUT of the second buffer device 202.

As known to those skilled in the art, the second buffer device 202 is arranged to receive the input signal VI and to provide the output signal VOUT of a value equal to VDD-VI.

However, the second buffer device 202 has the drawback that it is highly dependant on the supply voltage VDD, which involves a PSRR value such as to cause a strong degradation of the operational amplifier OA2 performance. Furthermore, for input signals near 0 Volts, the current does not circulate through the transistor M1, thereby the second buffer device 202 stability is degraded. Furthermore, also the second buffer device 202 has a rather reduced operating band.

In FIG. 5, a third buffer device 203 of a known type (alternative to those shown in FIGS. 3 and 4, respectively) is shown. It consists of a source follower represented by a MOS transistor M2 of the p-channel type having the source terminal connected to the supply voltage VDD through a current generator IC, and the drain terminal connected to the ground potential GND. The transistor M2 gate terminal represents the input terminal of the third buffer device 203 to receive the input voltage VI. The transistor M2 source terminal represents the output terminal of the third buffer device 203 to provide in output the output voltage VOUT.

As known to those skilled in the art, the third buffer device 203 of FIG. 5 results to be arranged to receive the input voltage VI and to provide the output voltage VOUT equal to VI+|VGS|. The output voltage VOUT results to be independent from the supply voltage VDD, therefore ensuring a better PSRR value than the solutions of FIGS. 3 and 4. Furthermore, the third buffer device 203 of FIG. 5 results to be usable also with input signals near 0 Volts (or also lower), thus ensuring a higher operating band compared to the solutions described with reference to FIGS. 3 and 4.

However, the third buffer device 203 of FIG. 5 has the drawback that the voltage VGS of the MOS transistor M2 is highly dependant on process and temperature variations.

BRIEF SUMMARY

An object of the present disclosure is to propose a voltage following, or buffer, device that overcomes the drawbacks and the limits of the above-mentioned buffer devices of the prior art and, in particular, that results to be substantially insensitive to process and temperature variations.

In an embodiment, a voltage following device for the driving of a sampling network (RCM) coupleable to an analog/digital converter, comprises: at least one first transistor provided with a first terminal to receive an input signal, and a second terminal to provide an output signal to the sampling network which is representative of the translation of the input signal of an amount equal to a gate and source voltage of said at least one first transistor, characterized in that it comprises a driving network of said at least one first transistor to keep said gate and source voltage equal to a preset reference voltage. In an embodiment, said driving network comprises a second transistor electrically connected in series to the at least one first transistor between a first reference potential and a second reference potential. In an embodiment, said driving network further comprises a third and a fourth transistor arranged in series one to the other between the first reference potential and the second reference potential. In an embodiment, the driving network further comprises a control network of the preset reference voltage. In an embodiment, said control network is an operational amplifier in an inverting configuration with unity gain provided with an inverting inlet to receive the preset reference voltage. In an embodiment, said second and fourth transistors have the respective gate terminal electrically connected to an output of the operational amplifier, the second, and the fourth transistors resulting in a current mirror configuration. In an embodiment, the third transistor has the respective gate terminal electrically connected to the second reference potential. In an embodiment, the third transistor has the source terminal electrically connected to a non-inverting inlet of the operational amplifier to impose, to the third transistor, a voltage between gate and source equal to the preset reference voltage. In an embodiment, said second and fourth transistors are such as to impose, to said at least one first transistor, a voltage between gate and source which is substantially equal to the voltage between gate and source of the third transistor. In an embodiment, said first, second, third, and fourth transistors are of the p-channel MOS type.

In an embodiment, an analog/digital conversion system, comprises: a signal source to provide an input signal; a voltage following device operatively associated to the signal source to receive said input signal and to provide an output signal; a sampling network operatively associated to the following device; an analog/digital converter operatively associated to said sampling network, said system being characterized in that said following device results to be in accordance with any one of the above described embodiments.

In an embodiment, a voltage following device to drive a sampling network (RCM) coupleable to an analog/digital converter, comprises: at least one first transistor provided with a first terminal to receive an input signal, and a second terminal to provide an output signal to the sampling network which is representative of a translation of the input signal of an amount equal to a gate and source voltage of the at least one first transistor; and a driving network of the at least one first transistor configured to keep the gate and source voltage at a shift voltage. In an embodiment, the driving network comprises a second transistor electrically connected in series with the at least one first transistor between a first reference potential and a second reference potential. In an embodiment, the driving network further comprises a third and a fourth transistor arranged in series between the first reference potential and the second reference potential. In an embodiment, the driving network further comprises a control network of the shift voltage. In an embodiment, the control network comprises an operational amplifier in an inverting configuration with unity gain provided with an inverting inlet to receive the shift voltage. In an embodiment, the second and fourth transistors have respective gate terminals electrically connected to an output of the operational amplifier, the second, and the fourth transistors in a current mirror configuration. In an embodiment, the third transistor has a gate terminal electrically connected to the second reference potential. In an embodiment, the third transistor has a source terminal electrically connected to a non-inverting inlet of the operational amplifier to impose, to the third transistor, a voltage between gate and source substantially equal to the shift voltage. In an embodiment, the second and fourth transistors are configured to impose, to said at least one first transistor, a voltage between gate and source which is substantially equal to the voltage between gate and source of the third transistor. In an embodiment, the first, second, third, and fourth transistors are of a p-channel MOS type.

In an embodiment, an analog/digital conversion system comprises: a signal source to provide an input signal; a voltage following device operatively associated to the signal source to receive the input signal and to provide an output signal; a sampling network operatively associated to the voltage following device; and an analog/digital converter operatively associated to said sampling network, wherein the voltage following device includes: a first transistor provided with a first terminal to receive the input signal, and a second terminal to provide the output signal to the sampling network, the output signal being substantially equal to a sum of the input signal and a shift reference voltage; and means for maintaining the gate and source voltage of the first transistor substantially at a level of the shift reference voltage. In an embodiment, the means for maintaining comprises a second transistor electrically coupled in series with the first transistor between a first reference potential and a second reference potential. In an embodiment, the means for maintaining further comprises a third and a fourth transistor arranged in series between the first reference potential and the second reference potential. In an embodiment, the means for maintaining further comprises an operational amplifier in an inverting configuration with unity gain provided with an inverting inlet to receive the shift reference voltage. In an embodiment, the second and fourth transistors have respective gate terminals electrically connected to an output of the operational amplifier, the second, and the fourth transistors in a current mirror configuration. In an embodiment, the third transistor has a gate terminal electrically connected to the second reference potential. In an embodiment, the third transistor has a source terminal electrically connected to a non-inverting inlet of the operational amplifier to impose, to the third transistor, a voltage between gate and source substantially equal to the shift reference voltage. In an embodiment, the second and fourth transistors are configured to impose, to the first transistor, a voltage between gate and source which is substantially equal to the voltage between gate and source of the third transistor. In an embodiment, the first, second, third, and fourth transistors are of a p-channel MOS type.

In an embodiment, a method of converting an analog source signal to a digital signal comprises: providing the analog source signal to an input of a first transistor; maintaining a gate-source voltage of the first transistor at a level of shift-reference voltage; and providing an output equal to a sum of the analog source voltage and the shift reference voltage. In an embodiment, maintaining the gate-source voltage of the first transistor at the level of the shift reference voltage comprising providing the shift reference voltage to an inverting input of an operational amplifier.

BRIEF DESCRIPTION OF THE SEVERAL VIEWS OF THE DRAWINGS

The disclosure will be better understood from the following detailed description in an embodiment thereof, given by way of non-limiting example, with reference to the annexed drawings, in which.

DETAILED DESCRIPTION

Figure 1:
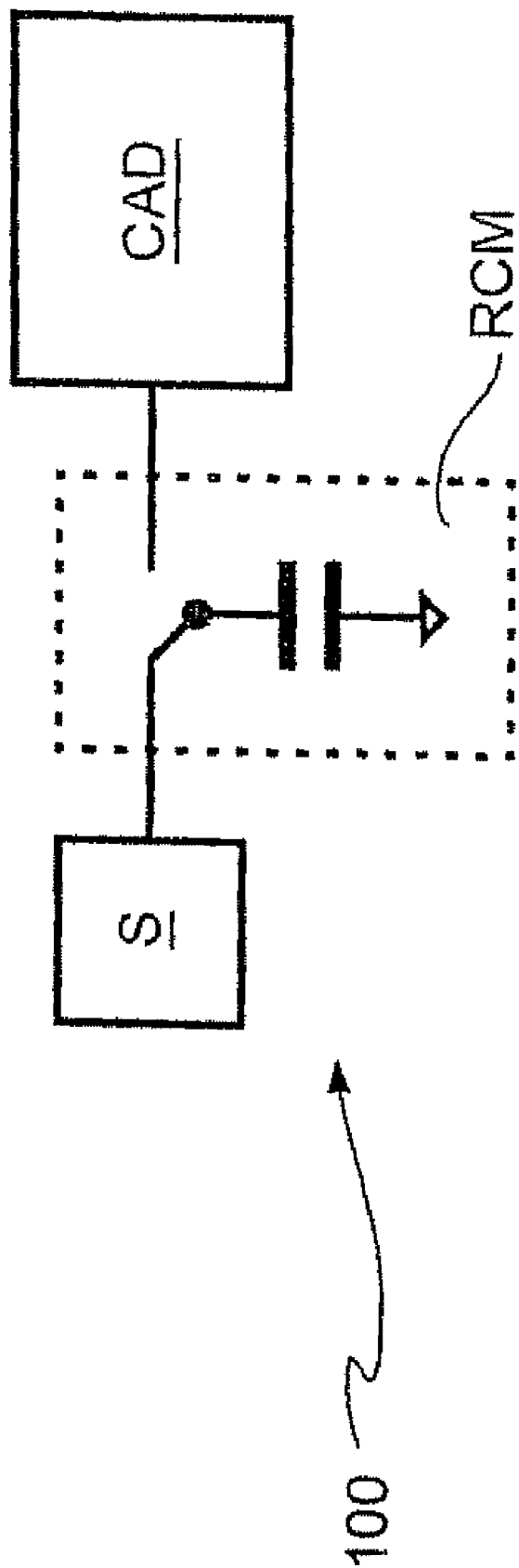
FIG. 1 schematically shows an analog/digital conversion system belonging to the prior art.
Figure 2:
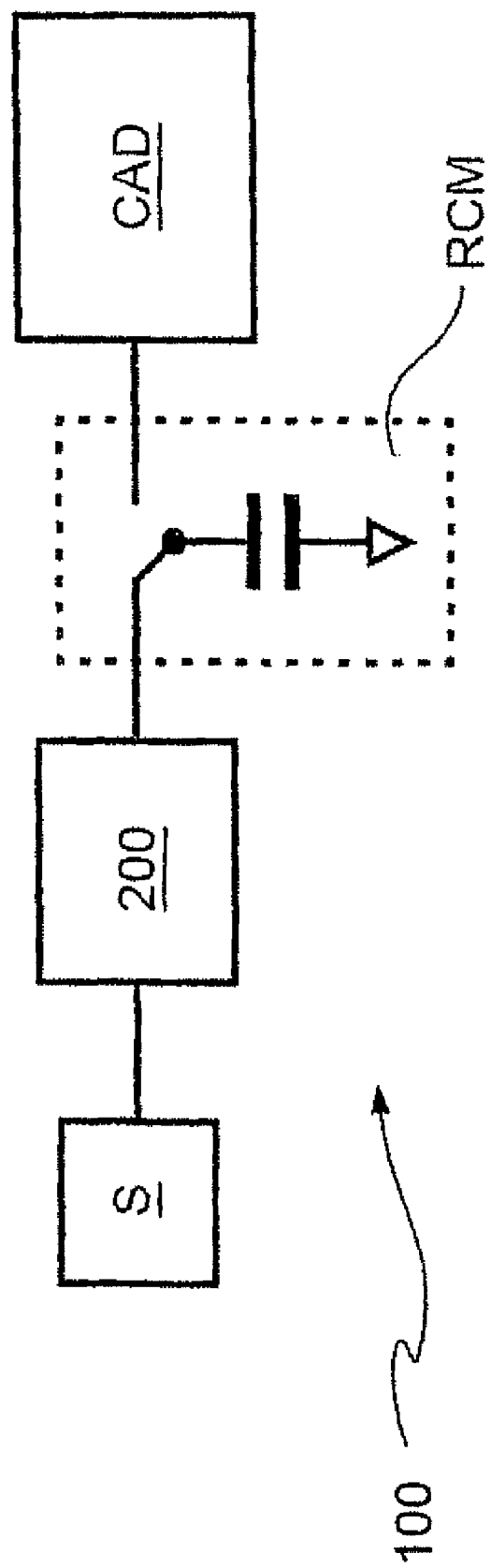
FIG. 2 schematically shows an analog/digital conversion system comprising a voltage following device.
Figure 3:
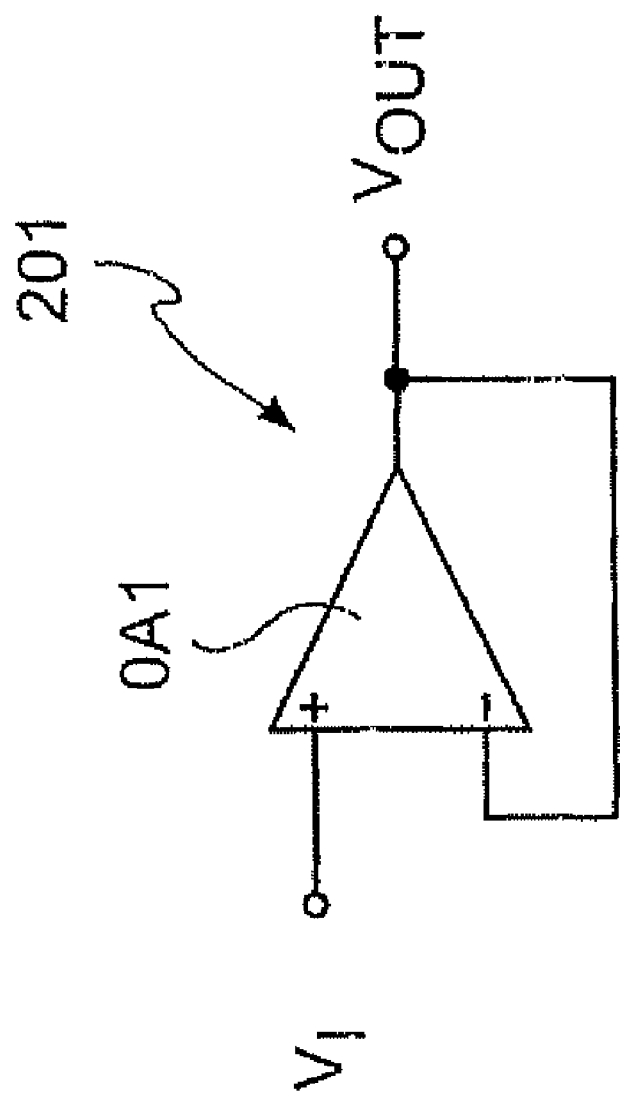
FIGS. 3 to 5 show, from a circuital point of view, voltage following devices which are alternative one to the other and belonging to the state of the art, which can be used in the system of FIG. 2.
Figure 4:
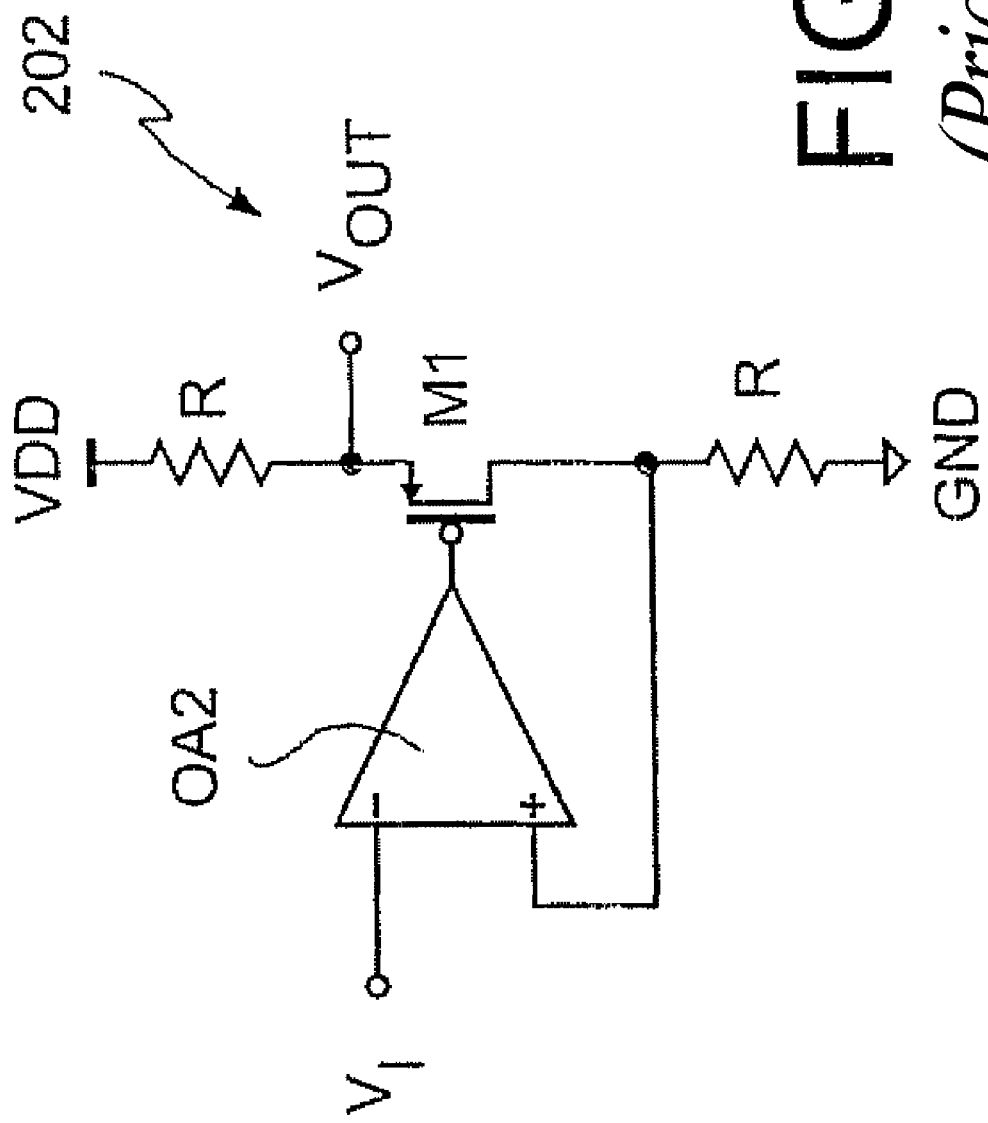
Figure 5:
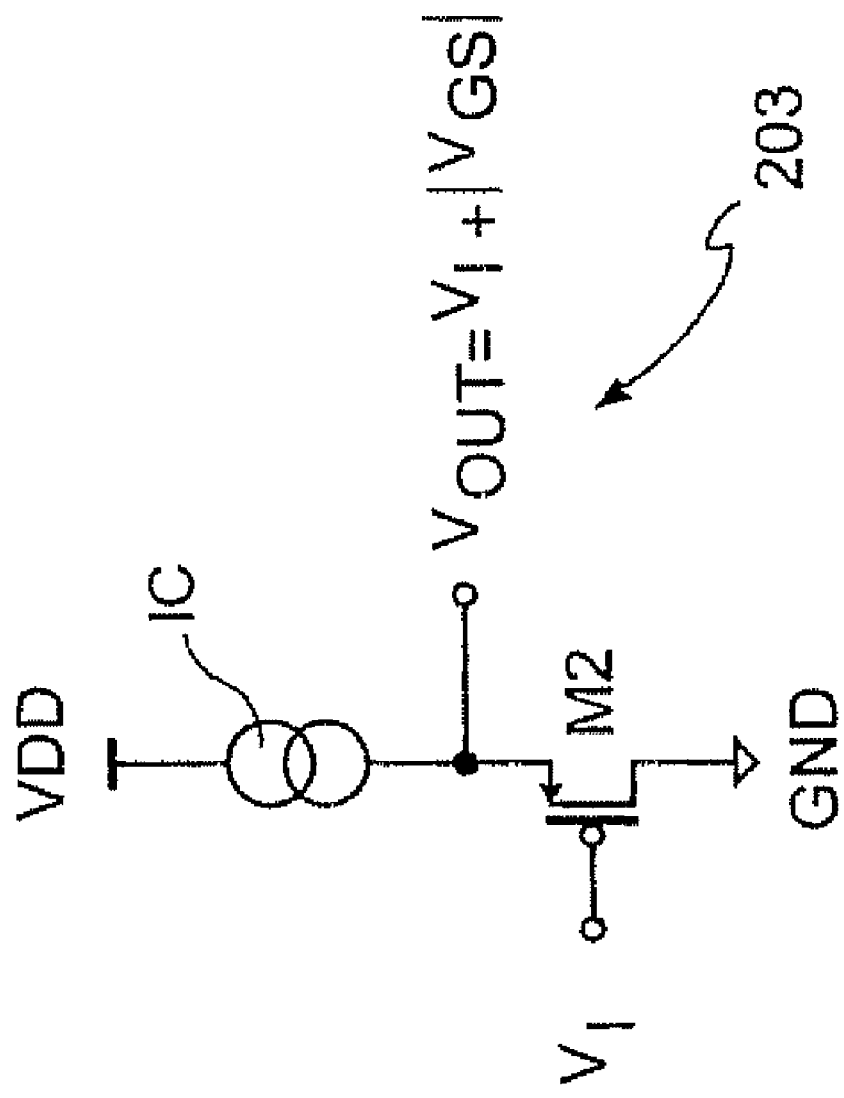
Figure 6:
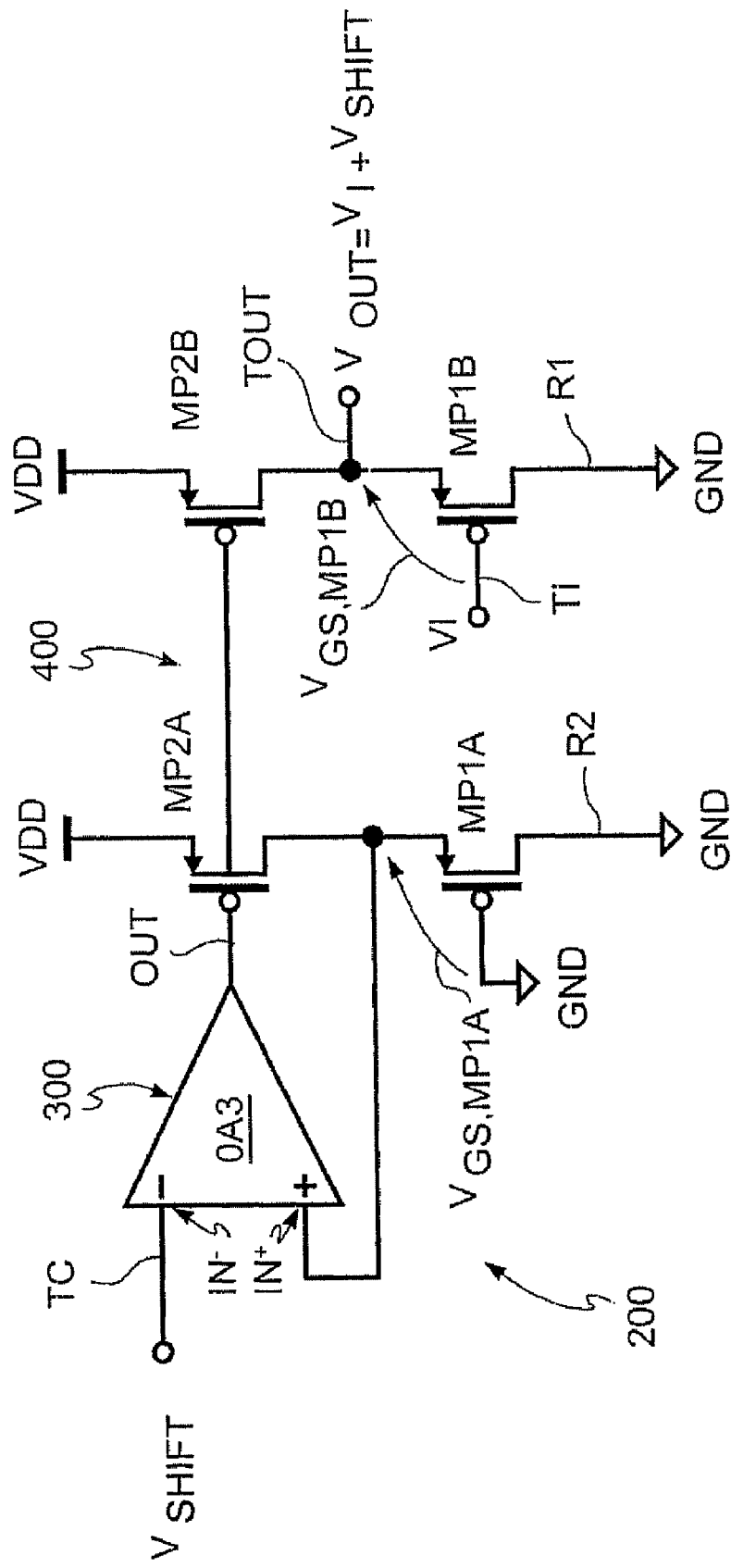
FIG. 6 shows a schematic of a voltage following device which can be used, for example, in the analog/digital conversion system of FIG. 2 according to an embodiment.

With reference to FIGS. 2 and 6, a voltage following device (hereinafter, for the sake of brevity, also only following device) is now described, generally indicated with the reference numeral 200, according to an example of an embodiment.

The voltage following device 200 is arranged for the driving of a sampling network RCM coupleable to an analog/digital converter CAD. It is pointed out that both the sampling network RCM and the A/D converter CAD, per se known, are shown in FIG. 2, representative of the system 100 for the A/D conversion of signals, but they are not reported, for illustrative simplicity, in FIG. 6.

The voltage following device 200 is provided with a control terminal TC to receive a shift reference voltage $V_{SHIFT}$, which may be preset, an input terminal Ti to receive an input signal VI, and an output terminal TOUT to provide an output voltage VOUT.

The voltage following device 200 further comprises a control network 300 of the shift reference voltage $V_{SHIFT}$. In the example embodiment, such control network 300 comprises an operational amplifier OA3 with an input of the p-channel type in an inverting configuration with unity gain. It shall be noticed that the operational amplifier OA3 inverting inlet represents the input terminal TC of the following device 200 to receive the shift reference voltage $V_{SHIFT}$.

The voltage following device 200 further comprises a source follower 400 operatively associated to the control network 300.

The source follower 400 comprises a first electric branch R1 comprising a first MP1B and a second MP2B p-channel MOS transistors arranged in series one to the other between a first reference potential VDD, for example the supply voltage, and a second reference potential GND, for example the ground potential.

In particular, the first transistor MP1B has the drain terminal electrically connected to the second reference potential GND, while the source terminal results to be electrically connected to the drain terminal of the second transistor MP2B.

It shall be noticed that the first transistor MP1B gate terminal represents the input terminal Ti of the following device 200 to receive the input signal VI, while the first transistor MP1B source terminal represents the output terminal TOUT of the following device 200 to provide the output signal VOUT to the sampling network RCM.

The second transistor MP2B has the source terminal electrically connected to the first reference potential VDD, and the gate terminal electrically connected to the output OUT of the operational amplifier OA3 of the control network 300.

The source follower 400 further comprises a second electric branch R2 comprising a third MP1A and a fourth MP2A transistors of the p-channel MOS type mutually electrically arranged in series between the first reference potential VDD and the second reference potential GND.

In particular, the third transistor MP1A has the gate terminal and the drain terminal electrically connected to the second reference potential GND, while the source terminal results to be electrically connected to the non-inverting inlet IN⁺ of the control network 300 operational amplifier OA3.

The fourth transistor MP2A has the source terminal electrically connected to the first reference potential VDD, the gate terminal electrically connected to the output OUT of the control network 300 operational amplifier OA3, and the drain terminal electrically connected to the third transistor MP1A source terminal, and contextually to the operational amplifier OA3 non-inverting inlet IN⁺.

The second MP2B and the fourth MP2A transistors of the MOS type result to be in a current mirror configuration so as to impose the same current intensity on both the first R1 and the second R2 electric branches of the source follower 400.

With particular reference to FIG. 6, the operative principle of the voltage following device 200 is now described.

It is restated that the current mirror represented by the second MP2B and fourth MP2A transistors imposes the same current in both the first MP1B and the third MP1A transistors of the MOS type. Therefore, the first MP1B and the third MP1A transistors advantageously result to be characterized by the same voltage between gate and source: $V_{GS,MP1B} = V_{GS,MP1A}$.

The source follower 400 is arranged to receive the input signal VI on the first transistor MP1B gate terminal (input terminal Ti of the following device 200), and to provide on the first transistor MP1B drain terminal (output terminal TOUT of the following device 200) the output signal VOUT equal to the translation of the input signal VI of an amount equal to the voltage between gate and source $V_{GS,MP1B}$ of the first transistor MP1B.

It shall be noticed that, according to the described embodiment, the operational amplifier OA3 of the control network 400 of the shift reference voltage $V_{SHIFT}$ imposes, to the third transistor MP1A, a voltage between gate and source $V_{GS,MP1A}$ which is equal to $V_{SHIFT}$.

From what has been stated before, the first transistor MP1B has a respective voltage between gate and source $V_{GS,MP1B} = V_{GS,MP1A}$, and therefore equal to the shift reference voltage $V_{SHIFT}$.

It shall be noticed that the operational amplifier OA3, the third transistor MP1A, and the fourth transistor MP2A (current mirror), and the second transistor MP2B generally represent a driving network of the first transistor MP1B to keep the first transistor MP1B gate and source voltage $V_{GS,MP1B}$ equal to the shift reference voltage $V_{SHIFT}$.

Advantageously, this allows having a following device 200 output voltage VOUT equal to VI+$V_{SHIFT}$, and therefore independent from the voltage between gate and source $V_{GS,MP1B}$ of the first transistor MP1B, and therefore insensitive to process, temperature, and also supply variations, therefore ensuring a high PSRR ratio.

From an electrical point of view, the voltage following device 200 of the described example advantageously exhibits the following characteristics:

input capacity of the voltage following device $C_{IN} = C_{GS,MP1B} \times (1 - A_V) + C_{GD,MP1B}$
in which, considering that $A_V$ represents the first transistor MP1B gain and that it is substantially near 1, the input capacity can be approximated as $C_{IN} \approx C_{OVERLAP}$, in which $C_{OVERLAP}$ represents, as known to those skilled in the art, the overlap capacity between gate and drain during the diffusion of the first transistor MP1B;

input impedance: considering that the input signal VI is provided to the gate terminal of the first transistor MP1B which has, as it is known, an input impedance virtually infinite, the voltage following device input impedance 200 is also to be considered as infinite;

useful operating band: the voltage following device of the described example has a dominant pole at the angular frequency of $$\omega_T = 1/(R_{OUT} \times C_{OUT}) \approx g_{m,MP1B}/C_{OUT}$$

in which the output impedance and carrying capacity of the voltage following device 200, are indicated with $R_{OUT}$ and $C_{OUT}$, respectively.

It shall be noticed that such dominant pole is at a higher frequency than the solutions which employ operational amplifiers as a follower or buffer device.

For example, from an applicative point of view, in modern processes, and considering a carrying capacity COUT equal, for example, to 1 pF (typical of many A/D converters) and a current dissipated by the first MP1B and the second MP2B transistors (first electric branch R1) within values ranging, for example, between 50 and 100 µA (typical of low power applications), the following device of the described example can ensure an operating band of some GHz (for example of a value ranging between 1-10 GHz).

The voltage following device 200 according to the described embodiment can be employed in an analog/digital conversion system as that of the example schematically illustrated in FIG. 2.

The conversion system 100 of FIG. 2 comprises a signal source S operatively associated to the following device 200 to provide an input signal VI thereto.

The conversion system 100 further comprises a sampling network RCM operatively associated to the following device 200 to receive the output signal VOUT equal to VI+$V_{SHIFT}$. The conversion system 100 further comprises an A/D converter CAD arranged to receive the output signal VOUT from the following device 200.

The conversion system 100 comprising the following device according to the described exemplary embodiment can be advantageously employed, for example, in the audio, general-purpose, or Radio Frequency (RF) fields.

As it shall be observed, in an embodiment the object of the present disclosure is fully achieved, since the voltage following device 200 of the described example allows providing an output signal VOUT to the sampling network RCM, and therefore to the A/D converter CAD, which is equal to a translation of the input signal VI of an amount equal to the shift reference voltage $V_{SHIFT}$, thereby resulting independent from the voltage between gate and source of the first transistor MP1B, and therefore substantially insensitive to process and temperature variation.

Furthermore, the fact that the output voltage VOUT does not depend on the first reference potential VDD (supply) either, allows that the voltage following device 200 advantageously maintains a high power rejection ratio PSRR.

Again, the fact that the input signal VI is provided to the gate terminal of the p-channel MOS-type first transistor MP1B allows the voltage following device 200 to have a substantially infinite input impedance.

Finally, the voltage following device 200, being able to ensure an operating band of some GHz, as described, advantageously represents a high-speed device for the driving of a sampling network coupleable to an A/D converter.

To the above-described embodiments of the device, those of ordinary skill in the art, in order to meet contingent needs, will be able to make modifications, adaptations, and replacements of elements with other functionally equivalent ones, without departing from the scope of the following claims. Each of the features described as belonging to a feasible embodiment can be implemented independently from the other embodiments described.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage following device to drive a sampling network (RCM) coupleable to an analog/digital converter, comprising:
   at least one first transistor provided with a first terminal to receive an input signal, and a second terminal to provide an output signal to the sampling network which is representative of a translation of the input signal of an amount equal to a gate and source voltage of the at least one first transistor; and
   a driving network of the at least one first transistor configured to keep the gate and source voltage at a shift voltage.

2. The voltage following device of claim 1 wherein the driving network comprises a second transistor electrically connected in series with the at least one first transistor between a first reference potential and a second reference potential.

3. The voltage following device of claim 2 wherein the driving network further comprises a third and a fourth transistor arranged in series between the first reference potential and the second reference potential.

4. The voltage following device of claim 3 wherein the driving network further comprises a control network of the shift voltage.

5. The voltage following device of claim 4 wherein the control network comprises an operational amplifier in an inverting configuration with unity gain provided with an inverting inlet to receive the shift voltage.

6. The voltage following device of claim 5 wherein the second and fourth transistors have respective gate terminals electrically connected to an output of the operational amplifier, the second, and the fourth transistors in a current mirror configuration.

7. The voltage following device of claim 6 wherein the third transistor has a gate terminal electrically connected to the second reference potential.

8. The voltage following device of claim 7 wherein the third transistor has a source terminal electrically connected to a non-inverting inlet of the operational amplifier to impose, to the third transistor, a voltage between gate and source substantially equal to the shift voltage.

9. The voltage following device of claim 6 wherein the second and fourth transistors are configured to impose, to said at least one first transistor, a voltage between gate and source which is substantially equal to the voltage between gate and source of the third transistor.

10. The voltage following device of claim 3 wherein the first, second, third, and fourth transistors are of a p-channel MOS type.

11. The voltage following device of claim 1 wherein the driving network comprises a current mirror.

12. An analog/digital conversion system, comprising:
   a signal source to provide an input signal (VI);
   a voltage following device operatively associated to the signal source to receive the input signal and to provide an output signal;
   a sampling network operatively associated to the voltage following device; and an analog/digital converter operatively associated to said sampling network, wherein the voltage following device includes:
- a first transistor provided with a first terminal to receive the input signal, and a second terminal to provide the output signal to the sampling network, the output signal being substantially equal to a sum of the input signal and a shift reference voltage; and
- means for maintaining the gate and source voltage of the first transistor substantially at a level of the shift reference voltage.

13. The analog/digital conversion system of claim 12 wherein the means for maintaining comprises a second transistor electrically coupled in series with the first transistor between a first reference potential and a second reference potential.

14. The analog/digital conversion system of claim 13 wherein the means for maintaining further comprises a third and a fourth transistor arranged in series between the first reference potential and the second reference potential.

15. The analog/digital conversion system of claim 14 wherein the means for maintaining further comprises an operational amplifier in an inverting configuration with unity gain provided with an inverting inlet to receive the shift reference voltage.

16. The analog/digital conversion system of claim 15 wherein the second and fourth transistors have respective gate terminals electrically connected to an output of the operational amplifier, the second, and the fourth transistors in a current mirror configuration.

17. The analog/digital conversion system of claim 16 wherein the third transistor has a gate terminal electrically connected to the second reference potential.

18. The analog/digital conversion system of claim 17 wherein the third transistor has a source terminal electrically connected to a non-inverting inlet of the operational amplifier to impose, to the third transistor, a voltage between gate and source substantially equal to the shift reference voltage.

19. The analog/digital conversion system of claim 18 wherein the second and fourth transistors are configured to impose, to the first transistor, a voltage between gate and source which is substantially equal to the voltage between gate and source of the third transistor.

20. The analog/digital conversion system of claim 14 wherein the first, second, third, and fourth transistors are of a p-channel MOS type.

21. The analog/digital conversion system of claim 12 wherein the means for maintaining comprises a current mirror.

22. A method of converting an analog source signal to a digital signal, the method comprising:
- providing the analog source signal to an input of a first transistor;
- maintaining a gate-source voltage of the first transistor at a level of shift-reference voltage, wherein maintaining the gate-source voltage of the first transistor at the level of the shift reference voltage comprises providing the shift reference voltage to an inverting input of an operational amplifier; and
- providing an output equal to a sum of the analog source voltage and the shift reference voltage.

* * * * *